United States Patent
Evans, Jr. et al.

(10) Patent No.: US 7,845,542 B2
(45) Date of Patent: Dec. 7, 2010

(54) MONITORING DEFORMATION AND TIME TO LOGICALLY CONSTRAIN A BONDING PROCESS

(75) Inventors: Daniel D. Evans, Jr., Oceanside, CA (US); James D. O'Bryan, Jr., Vista, CA (US)

(73) Assignee: Palomar Technologies, Inc. DE (US)

( * ) Notice: Subject to any disclaimer, the term of this patent is extended or adjusted under 35 U.S.C. 154(b) by 1167 days.

(21) Appl. No.: 11/233,553

(22) Filed: Sep. 22, 2005

(65) Prior Publication Data

US 2007/0062634 A1    Mar. 22, 2007

(51) Int. Cl.
*B23K 20/10* (2006.01)
*B23K 1/06* (2006.01)

(52) U.S. Cl. .................... 228/102; 228/103; 228/180.5; 228/110.1

(58) Field of Classification Search ......... 228/102–105, 228/110.1, 180.5
See application file for complete search history.

(56) References Cited

U.S. PATENT DOCUMENTS

| | | | |
|---|---|---|---|
| 4,523,071 A | 6/1985 | Bancroft et al. | |
| 4,600,138 A | 7/1986 | Hill | |
| 4,984,730 A | 1/1991 | Gobel et al. | |
| 4,998,664 A | 3/1991 | Gibson et al. | |
| 5,148,967 A | 9/1992 | Gabaldon et al. | |
| 5,314,105 A | 5/1994 | Farassat | |
| 5,323,952 A * | 6/1994 | Kato et al. | 228/102 |
| 5,431,324 A * | 7/1995 | Kajiwara et al. | 228/102 |
| 5,459,672 A | 10/1995 | Cawelti et al. | |
| 6,102,275 A | 8/2000 | Hill et al. | |
| 6,237,833 B1 * | 5/2001 | Ikoma | 228/104 |
| 6,622,903 B1 | 9/2003 | Greenwell | |

* cited by examiner

*Primary Examiner*—Jessica L Ward
*Assistant Examiner*—Kevin E Yoon
(74) *Attorney, Agent, or Firm*—Rodney F. Brown (57) ABSTRACT

A process control procedure for a bonding process includes predetermining a deformation limit and a deforming time limit is for deforming a bonding precursor member. The bonding precursor member is deformed while monitoring instantaneous deformation values and instantaneous deforming time values for the bonding precursor member. A deforming shut-down time value is set at an instantaneous deforming time value corresponding to an occurrence of a first condition or a second condition. The first condition is an instantaneous deformation value for the bonding precursor member reaching the deformation limit and the second condition is an instantaneous deforming time value for the bonding precursor member reaching the deforming time limit. Deformation of the bonding precursor member is shut down at the deforming shut-down time value, thereby producing a deformed bond member from the bonding precursor member.

28 Claims, 6 Drawing Sheets

ADAPTIVE BOND DEFORMATION

MONITORING DEFORMATION AND TIME TO LOGICALLY CONSTRAIN A BONDING PROCESS

TECHNICAL FIELD

The present invention relates generally to automated bonding processes and more particularly to a process control procedure which monitors deformation and time in a bonding process to logically constrain the process, thereby narrowing the range of variation in the geometric parameters of deformed bond members produced by the process.

BACKGROUND OF THE INVENTION

Microelectronic components, such as integrated circuits, semiconductors, and the like, which are termed workpieces in the present context, typically have many electrically conductive pads requiring conductive connection with one or more cooperative electrically conductive pads on the same workpiece or on one or more other associated workpieces. Conductive connection of the pads is conventionally provided by a wire segment which is bonded to a bond site on each of the pads using an automated wire bonding machine having a high degree of speed and precision. U.S. Pat. No. 6,102,275, which is incorporated herein by reference, discloses a bond head for a wire bonding machine and an associated automated high-speed wire bonding process which are used to produce two specific types of wire bonds in series termed ball bonds and stitch bonds, respectively.

In a simple case of the ball and stitch bonding process disclosed in U.S. Pat. No. 6,102,275, construction of an electrical connection between a first and a second bond site on a pad pair is initiated by feeding a wire from a wire supply to a capillary tool mounted to the bond head of the wire bonding machine. A free end of the wire, termed a wire tail, is suspended in air from the capillary tool and heated to form an essentially spherical, free air ball from the wire tail. The tool positions the free air ball at the first bond site, which is on one pad of the pad pair where a ball bond is desired. The tool applies a downward compression force to press the free air ball against the pad while transmitting bonding energy to the free air ball from a cooperative ultrasonic transducer likewise mounted to the bond head of the wire bonding machine. The combination of compression force and bonding energy deforms the free air ball onto the pad from its previously undeformed essentially spherical shape to a deformed more flattened shape, thereby joining the ball and pad at the first bond site to create the ball bond defined by the flattened ball.

Upon completion of the ball bond, the tool is displaced away from the first bond site along a predetermined pathway to a second bond site at the remaining pad of the pad pair which is on the same or a different workpiece. One end of the wire is retained in attachment with the ball bond at the first bond site while additional wire is played out to the tool from the wire supply. As a result, a wire segment extends from the ball bond at the first bond site to the tool at the second bond site. The tool applies a downward compression force to press the wire segment against the pad at the second bond site while transmitting bonding energy to the wire from the ultrasonic transducer. The combination of compression force and bonding energy deforms the wire against the pad from its previously undeformed intact shape to a deformed crimped shape, thereby joining the wire and pad at the second bond site to create the stitch bond defined by the wire crimp.

Upon completion of the stitch bond, the bond tool is displaced to a remote position away from the second bond site while the wire is retained in attachment with the stitch bond at the second bond site and additional wire is played out to the tool from the wire supply to form a new wire tail extending from the stitch bond at the second bond site to the tool at the remote position. The ball and stitch bonding cycle is completed by breaking off the wire tail from the stitch bond at the second bond site while retaining the stitch bond in engagement with the pad. The above-recited cycle may be repeated as often as desired on additional pad pairs.

Ball and stitch bonding is also applicable to more complex cases where a serial electrical connection is desired between a series of three or more pads. In accordance with the more complex case, a ball bond is formed on the first pad of the series in the manner recited above and stitch bonds are subsequently formed on each succeeding pad in the series. However, the wire is not broken off from each stitch bond as in the earlier case, but is only broken off when the final stitch bond in the series is completed.

An alternate related microelectronic application of the bond head of U.S. Pat. No. 6,102,275 is disclosed in U.S. Pat. No. 6,622,903, which is also incorporated herein by reference. In accordance with U.S. Pat. No. 6,622,903, the bond head of the wire bonding machine is employed to mount a ball bump to a bond site on a surface of a workpiece. The ball bump has subsequent utility for conductively bonding the workpiece on which the ball bump is mounted to a bond site on the surface of another workpiece. Alternatively or additionally the ball bump has utility for controlling the geometric spacing between the bonded workpieces or the joint height of the bonded workpieces.

The workpieces are usually either a wafer or a substrate. A wafer typically consists of a plurality of grouped die which all share a continuous common surface. A substrate is typically a relatively large planar structure such as a printed circuit or an integrated circuit package. In an exemplary microelectronic application of a ball bump, each die on a wafer is a tiny semiconductor component, such as a diode, transistor or integrated circuit, which has one or more die pads on the surface of the die, each die pad defining a discrete bond site. A ball bump is mounted to each die pad on the wafer and the wafer is subsequently cut into individual die, each of which has one or more ball bumps mounted thereto depending on the number of die pads on the surface of the die. Thereafter, each die pad is bonded to a corresponding bond site on the surface of a substrate by means of the ball bump on the die pad, wherein each bond site on the substrate is defined by a substrate pad.

The ball bumps are mounted to the die pads on the wafer using substantially the same automated high speed wire bonding process described above to form ball bonds. However, in the case of ball bumps, formation of the stitch bond is omitted after each free air ball is deformed and correspondingly mounted to a die pad on the wafer. Instead, the wire is broken away from the ball bump after deformation and mounting. The resulting ball bumps, nevertheless, have essentially the same deformed flattened shape relative to the undeformed free air ball as do the ball bonds. Likewise, the ball bumps join the die pads with the substrate pads in a manner similar to ball bonding by compressing all the ball bumps against the pad substrates in unison while simultaneously heating or otherwise applying energy to the ball bumps. Because the ball bumps are formed from an electrically conductive metal, the ball bumps function not only as an adhesive joint, but as an electrical conductor between the die and substrate.

Yet another alternate related microelectronic application of a bonding machine, which has a bond head and tool mounted thereto, employs the bond head to electrically connect a tab lead to a die or substrate pad. The tab lead is one of a plurality of tab leads, which are electrically conductive and which have been press mounted into a pattern on a flexible medium. The bond head bonds the tab lead to the pad at a bond site, which results in an electrical connection between the tab lead and the pad termed a tab bond.

The structural integrity and operational performance of ball bumps, ball bonds, stitch bonds, tab bonds, and other like deformed bond members, which are produced in the manner described above, are inter alia a function of certain geometric parameters of the deformed bond member, such as the height of the deformed ball bond or ball bump for a given free air ball diameter, the impression depth of a stitch bond for a given wire diameter, or the impression depth of a tab bond for a given tab lead thickness. It has specifically been found that the degree of deformation the bond head imposes on an undeformed ball, wire, or tab lead is a good predictor of the ultimate integrity and performance characteristics of the deformed bond member. Accordingly, the operator effects process control for production of the deformed bonded structure by 1) predetermining a fixed bonding energy application time which the practitioner believes will achieve a desired degree of deformation of the final product, and 2) coupling the bonding energy from the activated ultrasonic transducer to the undeformed free air ball, intact wire, or intact tab lead for the fixed bonding energy application time to produce a deformed bond member.

Although the above-recited process control procedure results in a relatively high percentage of acceptable final products, significant variability nevertheless remains in the geometric parameters of the ball bonds, stitch bonds, ball bumps, and tab bonds over a large sample of such deformed bond members. This variability typically follows a normalized distribution and produces a significant number of unacceptable final products, i.e., ball bonds, stitch bonds, ball bumps, and tab bonds, exhibiting values of geometric parameters outside acceptable limits. The acceptable limits for the values of geometric parameters have become increasingly finer as the microelectronic components and the electronic systems in which the components are utilized have in general shrunken in size.

For any given geometric parameter, the variability of the parameter is the result of many inherent process variables which influence the coupling of bonding energy from the ultrasonic transducer to the free air ball, intact wire, or intact tab lead. Such inherent process variables include the composition of the material from which the pad, wire and/or tab lead are fabricated, the configuration and dimensions of the bond site and the wire, and the degree of wear exhibited by the tool, to name but a few. Unfortunately many of these inherent process variables are neither readily measurable nor readily controllable by the operator of the bonding machine. Accordingly, the practitioner must accept deformed bond members exhibiting geometric parameters which have an undesirably broad distribution as an unavoidable consequence of conventional automated high-speed bonding processes.

The present invention recognizes a need for an automated high-speed bonding process which produces ball bonds, stitch bonds, ball bumps, tab bonds, or the like with geometric parameters having a relatively narrow distribution, such that the geometric parameters fall within acceptable production tolerances. Accordingly, it is generally an object of the present invention to provide an automated high-speed bonding process which produces ball bonds, stitch bonds, ball bumps, tab bonds, or the like with geometric parameters having a relatively narrow distribution. More particularly, it is an object of the present invention to provide a process control procedure for operation of an automated high-speed bonding machine which enables the machine to produce ball bonds, stitch bonds, ball bumps, tab bonds, or the like with geometric parameters having a relatively narrow distribution. It is another object of the present invention to provide a process control procedure adapted to operation of a conventional bonding machine which enables the machine to produce ball bonds, stitch bonds, ball bumps, tab bonds, or the like with geometric parameters having a relatively narrow distribution. These objects and others are accomplished in accordance with the invention described hereafter.

SUMMARY OF THE INVENTION

The present invention is a process control procedure for a bonding process. A deformation limit is predetermined for deforming a bonding precursor member and a deforming time limit is also predetermined for deforming the bonding precursor member. The bonding precursor member is preferably a free air ball, an intact wire, or an intact tab lead. The bonding precursor member is deformed while monitoring instantaneous deformation values and instantaneous deforming time values for the bonding precursor member. A deforming shut-down time value is set at an instantaneous deforming time value corresponding to an occurrence of a first condition or a second condition. The first condition is an instantaneous deformation value for the bonding precursor member reaching the deformation limit and the second condition is an instantaneous deforming time value for the bonding precursor member reaching the deforming time limit. Deformation of the bonding precursor member is shut down at the deforming shut-down time value, thereby producing a deformed bond member from the bonding precursor member. The deformed bond member is preferably a ball bond, a ball bump, a stitch bond, or a tab bond.

In accordance with one embodiment, the deformation limit for deforming the bonding precursor member is a deformation upper control limit and the deforming time limit is an actuator time upper control limit for a bonding energy actuator. The bonding energy actuator is preferably an ultrasonic transducer and the bonding energy is ultrasonic energy. The bonding precursor member is deformed in response to a bonding energy which is applied to the bonding precursor member from the bonding energy actuator in an activated state. The actuator shut-down time value is set at an earliest instantaneous actuator time value corresponding to an earliest occurrence of a first condition or a second condition. The first condition is an instantaneous deformation value of the bonding precursor member reaching the deformation upper control limit and the second condition is an instantaneous actuator time value reaching the actuator time upper control limit. Application of the bonding energy to the bonding precursor member is shut down at the actuator shut-down time value, thereby producing the deformed bond member from the bonding precursor member.

The present embodiment preferably further comprises serially applying the bonding energy from the activated bonding energy actuator to a plurality of additional bonding precursor members. The actuator shut-down time value is set for each of the plurality of additional bonding precursor members in accordance with the above-recited logic sequence. Application of the bonding energy to each of the plurality of additional bonding precursor members is serially shut down at each respective actuator shut-down time value, thereby producing a new deformed bond member from each of the plurality of additional bonding precursor members. Each of the new deformed bond members has a final deformation value and all the final deformation values form a constrained deformation distribution. The constrained deformation distribution is narrower than a deformation distribution for a plurality of deformed bond members each of which has a final deformation value determined by a fixed predetermined actuator shut-down time value.

The present embodiment preferably further comprises predetermining a nominal deformation value for deforming the bonding precursor member, which is less than the deformation upper control limit, and a nominal actuator time value for the bonding energy actuator, which is less than the actuator time upper control limit. The nominal actuator time value corresponds to a desired actuator shut-down time value for deforming the bonding precursor member and the nominal deformation value corresponds to a desired final deformation value for the deformed bond member. The final deformation values are distributed about the nominal deformation value.

In accordance with another embodiment of the present procedure, a plurality of deformation limits and time limits are predetermined. The predetermined deformation limits are a deformation upper control limit and a deformation lower control limit. The predetermined time limits are an actuator time upper control limit, an actuator time lower control limit, and a nominal actuator time value. The nominal actuator time value is between the actuator time upper control limit and the actuator time lower control limit. The actuator start time and the actuator time lower control limit define bounds of a first time interval. The actuator time lower control limit and the nominal actuator time value define bounds of a second time interval. The nominal actuator time value and the actuator time upper control limit define bounds of a third time interval.

The actuator shut-down time value is always set at an instantaneous actuator time value outside the first time interval. The actuator shut-down time value is set at an earliest instantaneous actuator time value within the second time interval if and when an instantaneous deformation value of the bonding precursor member is greater than the deformation upper control limit within the second time interval. The actuator shut-down time value is set at an earliest instantaneous actuator time value within the third time interval if and when an instantaneous deformation value of the bonding precursor member is greater than the deformation lower control limit within the third time interval. The actuator shut-down time value is set at the actuator time upper control limit if the instantaneous actuator time reaches the actuator time upper control limit before the actuator shut-down time value has been set.

The present embodiment preferably further comprises serially applying the bonding energy from the activated bonding energy actuator to a plurality of additional bonding precursor members. The actuator shut-down time value is set for each of the plurality of additional bonding precursor members in accordance with the above-recited logic sequence.

The present invention will be further understood from the drawings and the following detailed description.

DESCRIPTION OF PREFERRED EMBODIMENTS

The present invention is a process control procedure generally applicable to bonding processes which uses a bonding machine to manufacture a deformed bond member from a bonding precursor member. As the terms "bonding precursor member" and "deformed bond member" are used herein, bonding precursor members include undeformed free air balls, intact wire, intact tab leads, and other similar pre-bond starting materials, while deformed bond members include ball bumps, ball bonds, stitch bonds, tab bonds, and other similar bonded products. The present process control procedure is applicable to bonding processes which use a bonding machine to manufacture ball bumps or ball bonds from free air balls. The process control procedure is further applicable to bonding processes which use a bonding machine to manufacture stitch bonds from intact wire while optionally additionally cooperatively manufacturing ball bonds from free air balls. The process control procedure is still further applicable to bonding processes which use a bonding machine to manufacture tab bonds from intact tab leads.

Although the present process control procedure is not specific to any one type of bonding process, preferred bonding processes to which the present process control procedure is applicable are disclosed in U.S. Pat. Nos. 6,102,275 and 6,622,903, which are summarized above. The above-described tab bond process is also a preferred bonding process to which the present process control procedure is applicable. The present process control procedure and associated bonding processes are likewise not specific to any one type of bonding machine. Nevertheless, a preferred bonding machine having utility herein is an automated high-speed wire bonding machine employing a bond head of the type disclosed in U.S. Pat. No. 6,102,275 and summarized above.

In each of the above-recited bonding processes, requisite deformation of the bonding precursor member to produce the deformed bond member is effected by a deformation stage, which comprises two steps, 1) a force application step, wherein a compression force is applied to the bonding precursor member, and 2) an energy application step, wherein a bonding energy is applied to the bonding precursor member. The means for applying the compression force to the bonding precursor member is generally termed a force applicator. A preferred force applicator is a tool mounted to a bond head of a bonding machine. The force applicator is positioned adjacent to the bonding precursor member and mechanically driven onto the bonding precursor member by rotational or linear actuation while the bonding precursor member rests in a desired position on the bond site.

The means for applying the bonding energy to the bonding precursor member is generally termed a bonding energy actuator. A preferred bonding energy actuator is an ultrasonic transducer mounted to a bond head of a bonding machine. The bonding energy actuator couples outputted bonding energy, which is preferably ultrasonic energy, to the bonding precursor member via the force applicator while the bonding precursor member rests in position on the bond site. Alternate means for applying the compression force and/or applying the bonding energy to the bonding precursor member, which are not expressly disclosed herein, but which are within the purview of the skilled artisan, are also within the scope of the present invention.

Figure 1:
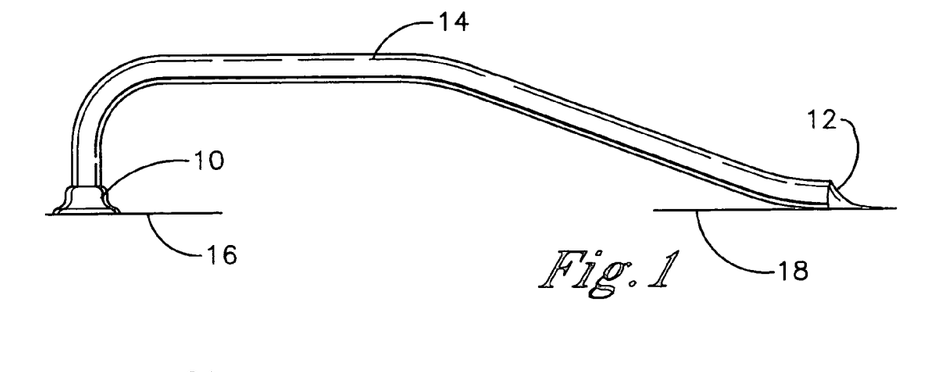
FIG. 1 is an elevational view of a ball bond and a stitch bond in cooperative combination which are constructed in accordance with a bonding process employing a process control procedure of the present invention.

Referring to FIG. 1, a ball bond 10, a stitch bond 12, and a connective wire segment 14 are shown, which have been constructed in accordance with the present process control procedure described hereafter. The ball bond 10 is fixably mounted to a first bond site 16, the stitch bond 12 is fixably mounted to a second bond site 18, and the connective wire segment 14 is attached to the ball bond 10 and the stitch bond 12, thereby extending between the first and second bond sites 16, 18 to provide conductive electrical communication therebetween. Although not shown, a ball bump constructed in accordance with the present process control procedure is essentially the same as the ball bond 10 of FIG. 1 except that the connective wire segment 14 is omitted.

Figure 2:
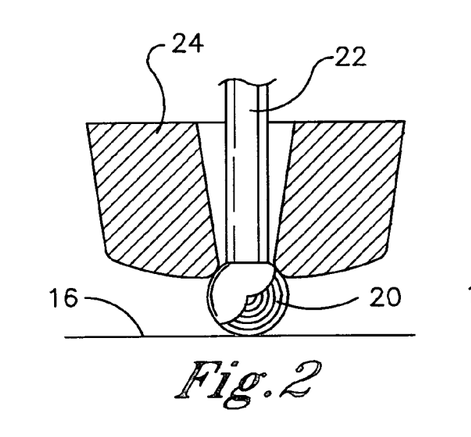
FIG. 2 is a cross-sectional side view of a free air ball at the beginning of a deformation stage of a ball bond or ball bump process.
Figure 3:
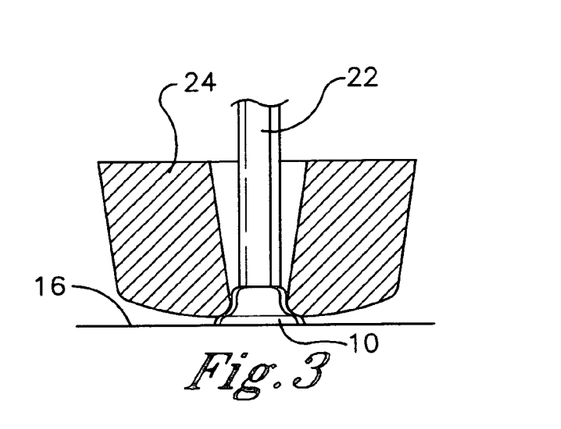
FIG. 3 is a cross-sectional side view of a ball bond or ball bump at the end of the deformation stage of FIG. 2.

FIG. 2 depicts an essentially spherically-shaped undeformed free air ball 20 at the beginning of the deformation stage of a preferred ball bond (or ball bump) process. The free air ball 20 extends from a feed wire 22 which is threaded through a capillary tool 24. The free air ball 20 rests on the first bond site 16 beneath the capillary tool 24. FIG. 3 depicts the flattened deformed ball bond 10 (or ball bump) at the end of the deformation stage. The ball bond 10 (or ball bump), like the free air ball 20 of FIG. 2, extends from the feed wire 22 beneath the capillary tool 24. However, unlike the free air ball 20 of FIG. 2, the ball bond 10 (or ball bump) is fixably mounted to the first bond site 16.

Figure 4:
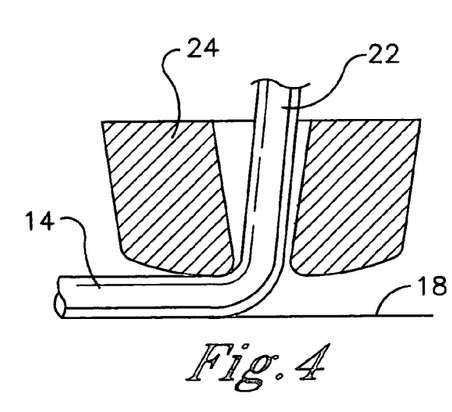
FIG. 4 is a cross-sectional side view of an intact wire segment at the beginning of a deformation stage of a stitch bond process.
Figure 5:
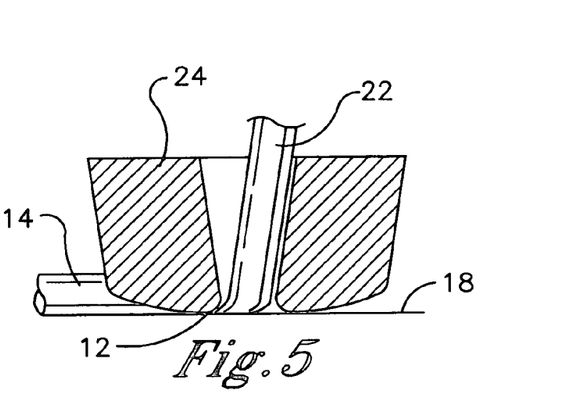
FIG. 5 is a cross-sectional side view of a stitch bond at the end of the deformation stage of FIG. 4.

FIG. 4 depicts the intact wire segment 14 at the beginning of the deformation stage of an alternate or cooperative preferred stitch bond process. The wire segment 14 is connected to both the ball bond 10 (shown in FIG. 1) and the feed wire 22 which is threaded through the capillary tool 24. The end of the wire segment 14 which is connected to the feed wire 22 rests on the second bond site 18 beneath the capillary tool 24. FIG. 5 depicts the crimped deformed stitch bond 12 at the end of the deformation stage and prior to a detachment stage, wherein the feed wire 22 is broken away from the stitch bond 12. The stitch bond 12, like the wire segment 14 of FIG. 4, is connected to the feed wire 22. However, unlike the wire segment 14 of FIG. 4, the stitch bond 12 is fixably mounted to the second bond site 18

Figure 6:
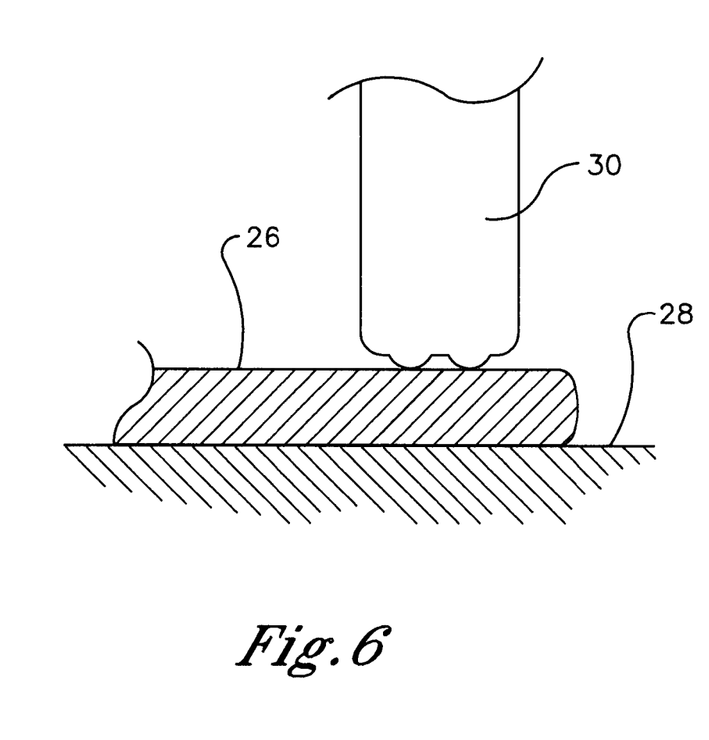
FIG. 6 is a cross-sectional side view of an intact tab lead at the beginning of a deformation stage of a tab bond process.
Figure 7:
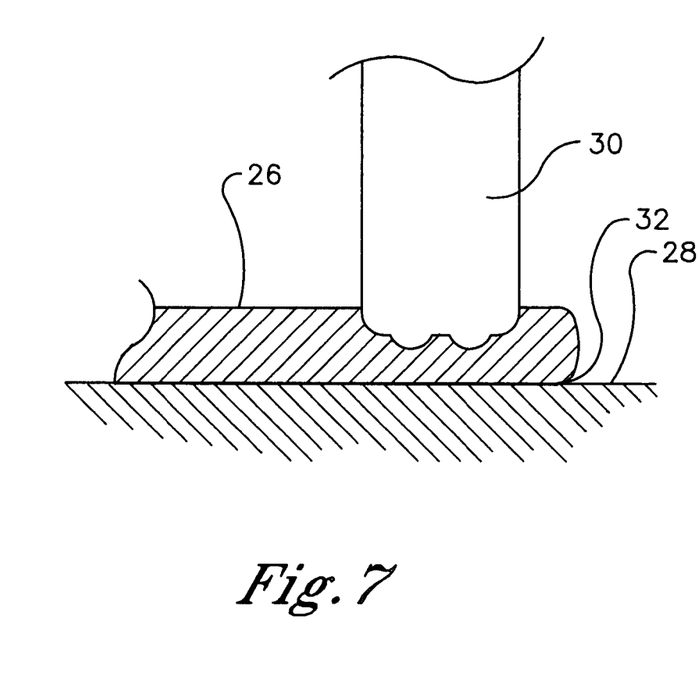
FIG. 7 is a cross-sectional side view of a tab bond at the end of the deformation stage of FIG. 6.

Referring to FIG. 6, an intact tab lead 26 is shown at the beginning of the deformation stage of a preferred tab bond process which includes the present process control procedure. The intact tab lead 26, which is integrally press mounted to a flexible medium (not shown), is positioned at rest on a bond site 28 of a pad while a specifically configured tab bond tool 30 is positioned onto the tab lead 26. FIG. 7 depicts the deformed tab bond 32 at the end of the deformation stage, wherein the tab bond 32 is fixably mounted to the bond site 28.

Figure 8:
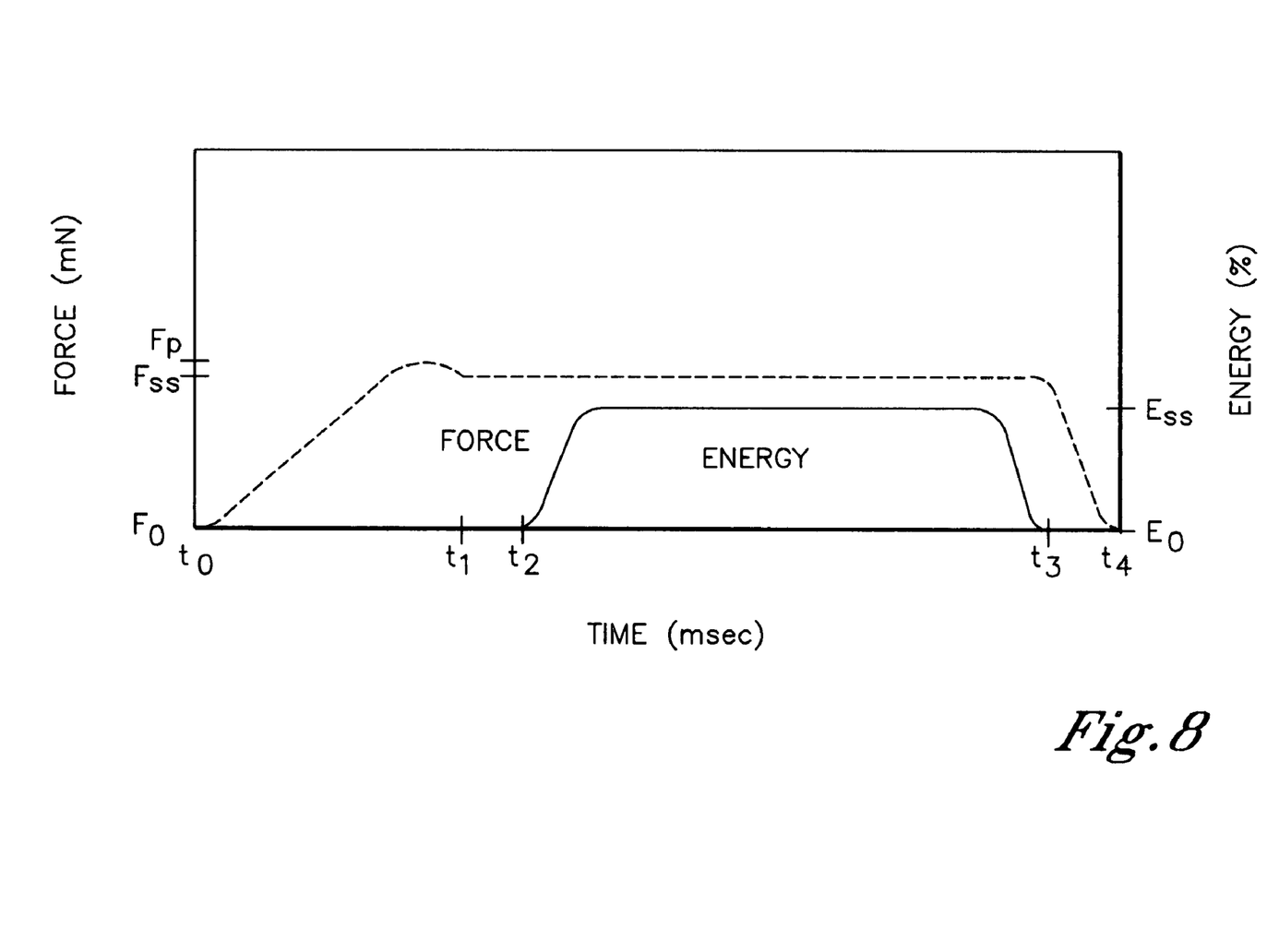
FIG. 8 is a graphical representation of compression force and bonding energy levels as a function of time during practice of the deformation stage of a bonding process.

FIG. 8 is a generalized graphical representation of a deformation stage of a bonding process, such as the ball bond (or ball bump) process of FIGS. 2 and 3, the stitch bond process of FIGS. 4 and 5, or the tab bond process of FIGS. 6 and 7. The left vertical y-axis of the graph is compression force F expressed in units of milliNewtons. The right vertical y-axis of the graph is bonding energy E expressed as a percentage of the maximum bonding energy output of the bonding energy actuator of the bonding machine which can be applied to the bonding precursor member. The horizontal x-axis of the graph is time t expressed in units of milliseconds.

The dashed line curve represents the compression force level as a function of time and is termed the compression force curve. The solid line curve represents the bonding energy level as a function of time and is termed the bonding energy curve. The compression force curve and the bonding energy curve each begin and end with a vertically sloped segment, which defines a start-up at the beginning of each curve and a shut-down at the end of each curve. The time durations of the start-up and shut-down are typically attributable to relatively brief, if not instantaneous, bonding machine response times to signals directing start-up or shut-down of the force application step or the energy application step as described hereafter. However, for purposes of the present description, the time durations of start-up and shut-down are treated as negligible.

Referring to FIG. 8, the force application step is initiated at the start of the deformation stage prior to initiation of the energy application step. The force application step is characterized by two serial substeps, i.e., an initial peak force substep and a subsequent steady-state force substep. The force application step has a relatively brief (i.e., negligible) start-up, wherein the bonding machine receives a force application start-up signal at a null time value $t_0$. The null time value to is termed the force application start time or, alternatively, the deformation stage start time. In response to the force application start-up signal, the force applicator applies a compression force to the bonding precursor member in a manner which increases the compression force level from a null force level $F_0$ at the force application start time to to a peak force level $F_P$. The compression force level can be decreased immediately upon reaching the peak force level $F_P$ to a steady-state force level $F_{SS}$ as shown FIG. 8 or, alternatively, the compression force level can be maintained at the peak force level $F_P$ for a discrete time interval before decreasing the compression force level to the steady-state force level $F_{SS}$. In any case, the peak force substep begins at the force application start time $t_0$ and is completed at a time value $t_1$ when the steady-state force level $F_{SS}$ is reached. Accordingly, the time value $t_1$ is termed the peak force end time or, alternatively, the steady-state force start time. The force application start time $t_0$ and the peak force end time $t_1$ define a peak force time interval $t_P$.

Once the steady-state force level $F_{SS}$ is reached at the steady-state force start time $t_1$, the compression force level is maintained constant at the steady-state force level $F_{SS}$ for a steady-state force time interval $t_{SSF}$ with the exception of a relatively brief (i.e., negligible) force application shut-down at the end of the force steady-state time interval $t_{SSF}$. In accordance with the force application shut-down, the bonding machine receives a force application shut-down signal which decreases the compression force level in response to the force application shut-down signal from the steady-state force level $F_{SS}$ to the null force level $F_0$ at a time value $t_4$.

Both the steady-state force substep and the force application step (which encompasses the steady-state force substep) are completed at the time value $t_4$, which is termed the force application end time or, alternatively, the deformation stage end time. The steady-state force start time $t_1$ and the force application end time $t_4$ define the steady-state force time interval $t_{SSF}$. The total time of the force application step $t_F$ is equal to the sum of the peak force time interval $t_P$ and the steady-state force time interval $t_{SSF}$. It is noted that the total time of the force application step $t_F$ is also identical to the total time of the deformation stage $t_D$. It is further noted that the peak force time interval $t_P$ preferably has a relatively short duration, while the steady-state force time interval $t_{SSF}$ preferably has a relatively long duration.

In summary, the force application step of FIG. 8 is characterized by the following equations:

$$t_P = t_1 - t_0 \quad (1)$$

$$t_{SSF} = t_4 - t_1 \quad (2)$$

$$t_D = t_F = t_P + t_{SSF} = t_4 - t_0 \quad (3)$$

$$t_{SSF} \gg t_P \quad (4)$$

The energy application step is initiated at a time value $t_2$ which is termed the energy application start time. The energy application step has a relatively brief (i.e., negligible) energy application start-up, wherein the bonding machine receives an energy application start-up signal. In response to the energy application start-up signal the bonding energy actuator couples a bonding energy to the bonding precursor member in a manner which increases the bonding energy level from a null energy level $E_0$ at the energy application start time $t_2$ to a steady-state energy level $E_{SS}$.

The bonding energy level is maintained constant at the steady-state energy level $E_{SS}$ for a steady-state energy time interval $t_{SSE}$ with the exception of a relatively brief (i.e., negligible) force application shut-down at the end of the energy steady-state time interval $t_{SSE}$. In accordance with the energy application shut-down, the bonding machine receives an energy application shut-down signal which decreases the bonding energy in response to the energy application shut-down signal from the steady-state energy level $E_{SS}$ to the null energy level $E_0$ at a time value $t_3$. Thus, the energy application step is completed at the time value $t_3$, which is termed the energy application end time. The energy application start time $t_2$ and energy application end time $t_3$ define the steady-state energy time interval $t_{SSE}$ which is equal to the total time of the energy application step $t_E$.

In summary, the energy application step of FIG. 8 is characterized by the following equation:

$$t_{SSE} = t_E = t_3 - t_2 \quad (5)$$

It is noted that even if the time durations of energy application start-up and energy application shut-down are each significantly greater than zero, the energy application start-up and shut-down time durations are each typically an essentially constant value for multiple serial occurrences of the energy application step during repeated operating cycles of a bonding machine. Thus, the contribution of the energy application start-up and shut-down to the total time of the energy application step $t_E$ is essentially constant and/or predictable for multiple serial occurrences of the energy application step. Accordingly, the time duration of energy application start-up and shut-down can essentially be disregarded for the present process control purposes.

It is further noted that the time relation between the force application step and the energy application step shown in FIG. 8 is exemplary and is not a specific limitation to the present process control procedure. Thus, start-up and/or shut-down of the energy application step can be effected independent of actions in the force application step. Nevertheless, it is preferred that the force application step overlaps at least a portion, if not the entirety, of the steady-state energy time interval $t_{SSE}$ as shown in FIG. 8.

Figure 9:
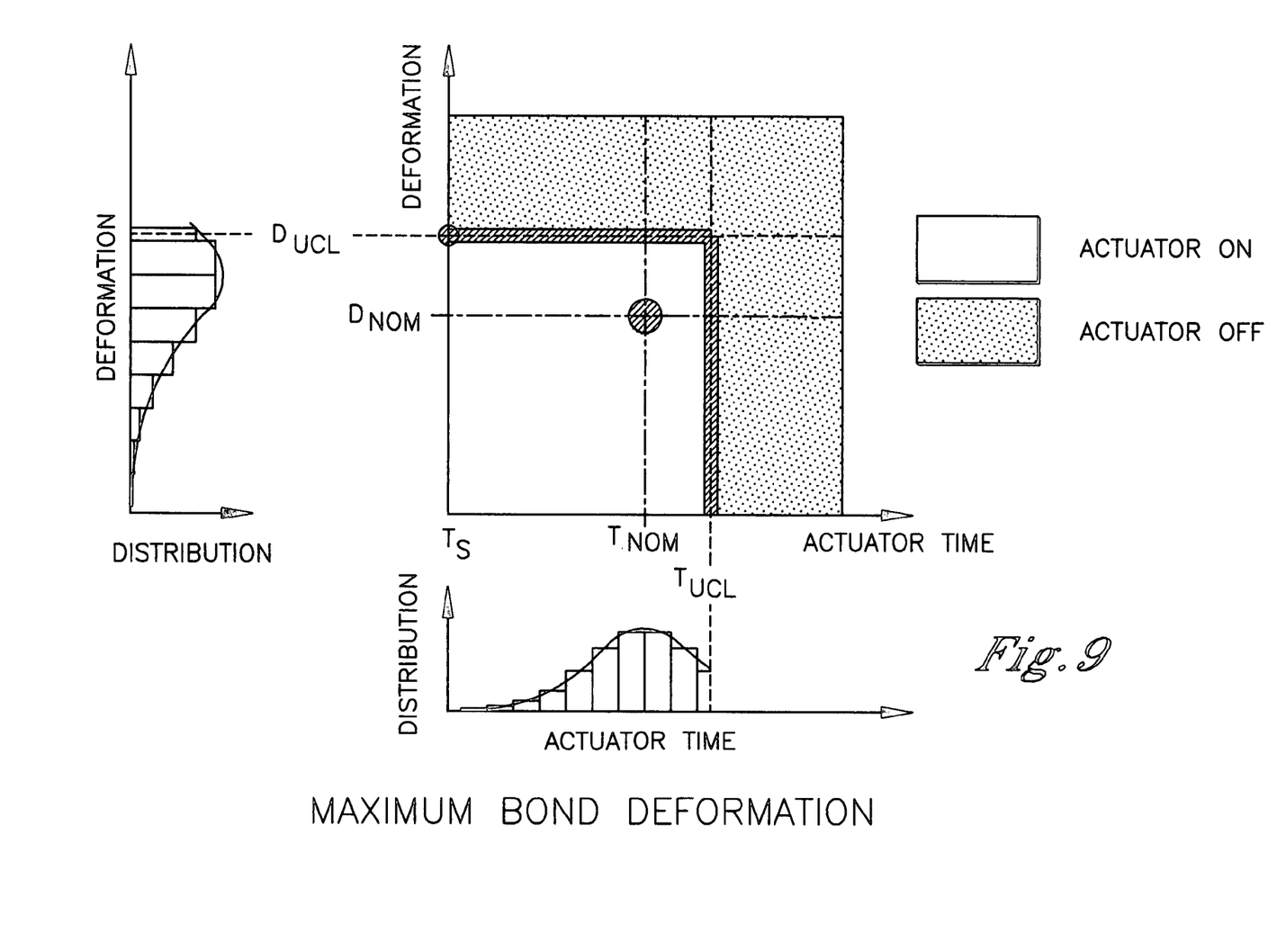
FIG. 9 is a graphical representation of a process control procedure of the present invention applied to an energy application step encompassed by the deformation stage of FIG. 8.

A preferred embodiment of the present process control procedure relates particularly to the above-described energy application step and more particularly to the total time of the energy application step $t_E$, which is essentially equal to the steady-state energy time interval $t_{SSE}$ of the energy application step. FIG. 9 is a generalized graphical representation of a first embodiment of a process control procedure of the present invention applied to the energy application step of a bonding process. FIG. 9 includes an operational graph displaying the manner in which the specified process control parameters logically constrain the operating regime of the bonding process. A first process control parameter, deformation D, is plotted on the vertical y-axis. Deformation is the relative degree to which a bonding precursor member is deformed as it is transformed by a bond head to a deformed bond member. A second process control parameter, actuator time T, is plotted on the horizontal x-axis. Actuator time is alternately termed bonding energy application time and is the relative time duration that the bond head applies bonding energy to the bonding precursor member In accordance with the present embodiment, a practitioner initially sets a nominal value for each of the process control parameters specified by the process control procedure, namely, the deformation D and the actuator time T. The nominal deformation value $D_{NOM}$ and the nominal actuator time value $T_{NOM}$ are target values, which, when simultaneously achieved as shown by their intersection point on the operational graph, produce an optimal or desired deformed bond member. The resulting optimal or desired deformed bond member exhibits a value of a relevant geometric parameter such as ball height or wire impression depth, which is correlated to optimal or desired structural integrity and operational performance characteristics of a deformed bond member. The practitioner typically sets the nominal values on the basis of known principles and other information obtained from any number of sources within the purview of the skilled artisan, such as experimental, empirical or theoretical data, modeling calculations, and the like.

Once the nominal deformation value $D_{NOM}$ and the nominal actuator time value $T_{NOM}$ are set, the practitioner uses the nominal values as a baseline for setting a deformation upper control limit $D_{UCL}$ and an actuator time upper control limit $T_{UCL}$. The deformation upper control limit $D_{UCL}$ is preferably set to a maximum deformation value of the deformed bond member which is tolerable in the bonding process. In particular, the deformation upper control limit $D_{UCL}$ may be set such that only deformed bond members exhibiting an acceptable degree of deformation which is below the deformation upper control limit $D_{UCL}$ are produced by the bonding process, while essentially no deformed bond members exhibiting an unacceptable degree of deformation which is above the deformation upper control limit $D_{UCL}$ are produced. For example, a deformation upper control limit $D_{UCL}$ can be set so that essentially no deformed bond members are produced which have a deformation value more than three standard deviations above the nominal deformation value $D_{NOM}$.

The actuator time upper control limit $T_{UCL}$ is similarly preferably set to a maximum actuator time value desirable in the bonding process. In particular, the actuator time upper control limit $T_{UCL}$ may be set such that the time for each bonding cycle of the bonding process never exceeds the economic efficiency limits of the bonding machine. The resulting predetermined deformation and actuator time upper control limits $D_{UCL}$ and $T_{UCL}$ are stored in a memory of an associated computer such as a desk top PC, which is in communication with a conventional bonding machine for monitoring and directing operation of the bonding machine. The process control procedure is preferably embodied in a series of instructions within a computer program which is likewise stored in the computer memory. It is understood that operation of the bonding machine described below proceeds in response to the instructions of the computer program embodying the process control procedure which is running on the associated computer during operation of the bonding machine.

Operation of the bonding machine is initiated by placing a workpiece, which includes a bond site, in an operative position relative to the capillary tool, which is mounted to the bond head of the bonding machine. The tool positions a bonding precursor member, such as a free air ball, intact wire, or intact tab lead, onto the bond site of the operatively positioned workpiece. The force application step of the deformation stage is initiated in the manner described above by applying a compression force to the bonding precursor member which tops out at the peak force level $F_P$. At the end of the peak force time interval, i.e., at the time value $t_1$ with reference to FIG. 8, the compression force is reduced to the steady-state force level $F_{SS}$.

Practice of the present embodiment of the process control procedure is effected by initiation of the energy application step, preferably simultaneous with or after initiation of the steady-state force substep. Referring to the operational graph of FIG. 9, the energy application step starts at an actuator start time value $T_S$ under the direction of the process control procedure by applying ultrasonic energy to the bonding precursor member in response to an energy application start-up signal. Application of the ultrasonic energy can be effected by switching the ultrasonic transducer from an "OFF" condition to an "ON" condition, thereby transitioning the ultrasonic transducer, which is transmissively linked to the bonding precursor member, from an inactive state to an activated state. The inactive state is characterized as either a low energy or an essentially zero energy output state. The active state is characterized as a high energy output state.

Alternatively application of the ultrasonic energy can be effected by completing a transmission linkage between the bonding precursor member and the activated ultrasonic transducer. In any case, the activated ultrasonic transducer applies ultrasonic energy to the bonding precursor member at a constant steady-state level via the capillary tool while the bonding precursor member rests on the bond site until the monitored actuator time value T coincides with a variable actuator shut-down time value $T_{SD}$ which is set in a manner described hereafter. It is noted that the actuator start time value $T_S$ corresponds to the time value $t_2$ of FIG. 8. The actuator shut-down time value $T_{SD}$ corresponds to the time value $t_3$ of FIG. 8.

Once the energy application step is initiated, the process control procedure continuously monitors the instantaneous deformation values D and the instantaneous actuator time values T to essentially instantaneously determine when to set the variable actuator shut-down time value $T_{SD}$ and shuts down the energy application step upon setting the actuator shut-down time value $T_{SD}$. Shut-down of the energy application step can be effected by switching the ultrasonic transducer from the "ON" condition to the "OFF" condition, thereby transitioning the ultrasonic transducer from the activated state to the inactive state. Alternatively shut-down can be effected by disconnecting the transmission linkage between the bonding precursor member and the activated ultrasonic transducer. In any case, the monitored instantaneous deformation and actuator time values D and T are used in association with the deformation and actuator time upper control limits $D_{UCL}$ and $T_{UCL}$ as logic constraints to set the variable actuator shut-down time value $T_{SD}$.

The actuator time values T are monitored by directly measuring the time duration that ultrasonic energy is applied to the bond precursor member from the ultrasonic transducer and is readily controlled by means such as switching the ultrasonic transducer between the "OFF" and "ON" conditions or connecting or disconnecting the transmission linkage between the bonding precursor member and the ultrasonic transducer. The deformation values D are monitored in real time by correlating deformation of the bonding precursor member to a specific geometric parameter thereof, which the practitioner is readily capable of directly measuring in real time or indirectly calculating in real time based on real time direct measurements of alternate parameters. A preferred correlation is between deformation and the real time ball height, wire impression depth, or tab lead impression depth of the bonding precursor member during the energy application step, both of which are readily directly measured or indirectly calculated from the measured travel distance of the capillary tool mounted to the bond head along the vertical rotary axis $Z_R$. Deformation of the bonding precursor member by the ultrasonic energy is readily terminated by effecting shut-down of the energy application step. It is noted that in the present embodiment, the monitored deformation of interest is limited to the deformation of the bonding precursor member which is attributable in whole or in part to the ultrasonic energy and does not include deformation which is attributable solely to the peak force level $F_P$, if any.

The variable actuator shut-down time value $T_{SD}$ is set in correspondence with the earliest occurrence of one of the following conditions: 1) the deformation value D of the bonding precursor member reaches the deformation upper control limit $D_{UCL}$, or 2) the actuator time value T reaches the time upper control limit $T_{UCL}$. In other words, shut-down of the energy application step is effected when the deformation value D of the bonding precursor member reaches the deformation upper control limit $D_{UCL}$ unless the actuator time value T reaches the time upper control limit $T_{UCL}$ first. In this case, shut-down of the energy application step is effected when the actuator time value T reaches the time upper control limit $T_{UCL}$ even though the final deformation value $D_F$ of the bonding precursor member is less than the deformation upper control limit $D_{UCL}$. In any case, shut-down ends the energy application step.

The above-described embodiment of the process control procedure is characterized as the maximum bond deformation logic sequence and is summarized in Table 1 below.

TABLE 1

| ACTUATOR TIME INTERVAL | ACTION |
|---|---|
| $T = T_S$ | switch ultrasonic transducer to "ON" condition |
| $T_S < T < T_{UCL}$ | switch ultrasonic transducer to "OFF" condition if and when $D > D_{UCL}$ $T = T_{SD}$; $T_S < T_{SD} < T_{UCL}$ |
| $T = T_{UCL}$ | switch ultrasonic transducer to "OFF" condition independent of D $T = T_{SD}$; $T_{SD} = T_{UCL}$ |

Although not shown in FIG. 9, termination of the force application step, which is preferably simultaneous with or after termination of the energy application step, ends the deformation stage and initiates any final stage required to complete the deformed bond member such as a detachment stage. Completion of the deformation stage and any required final stage constitutes completion of a single bonding cycle of the bonding machine. Any number of additional bonding cycles are performed in sequence thereafter in accordance with the present embodiment of the process control procedure to produce a like number of additional deformed bond members.

It is apparent from the above that practicing multiple bonding cycles of a bonding process which is logically constrained by the selected deformation upper control limit $D_{UCL}$ and actuator time upper control limit $T_{UCL}$ in accordance with the present embodiment of the process control procedure produces a plurality of deformed bond members having different final deformation values $D_F$. The final deformation values $D_F$ of the deformed bond members form a relatively narrow asymmetrical distribution about the nominal deformation value $D_{NOM}$. An exemplary distribution of the final deformation values $D_F$ of the deformed bond members is represented by a distribution curve in the deformation distribution graph of FIG. 9, which is positioned adjacent to the vertical y-axis for deformation in the operational graph of FIG. 9.

Practicing multiple bonding cycles of a bonding process in accordance with the present embodiment of the process control procedure likewise produces a plurality of deformed bond members having different actuator shut-down time values $T_{SD}$. The actuator shut-down time values $T_{SD}$ of the deformed bond members form an asymmetrical distribution about the nominal actuator time value $T_{NOM}$. An exemplary distribution of the actuator shut-down time values $T_{SD}$ of the deformed bond members is represented by a distribution curve in the time distribution graph of FIG. 9, which is positioned adjacent to the horizontal x-axis for actuator time in the operational graph of FIG. 9.

Figure 10:
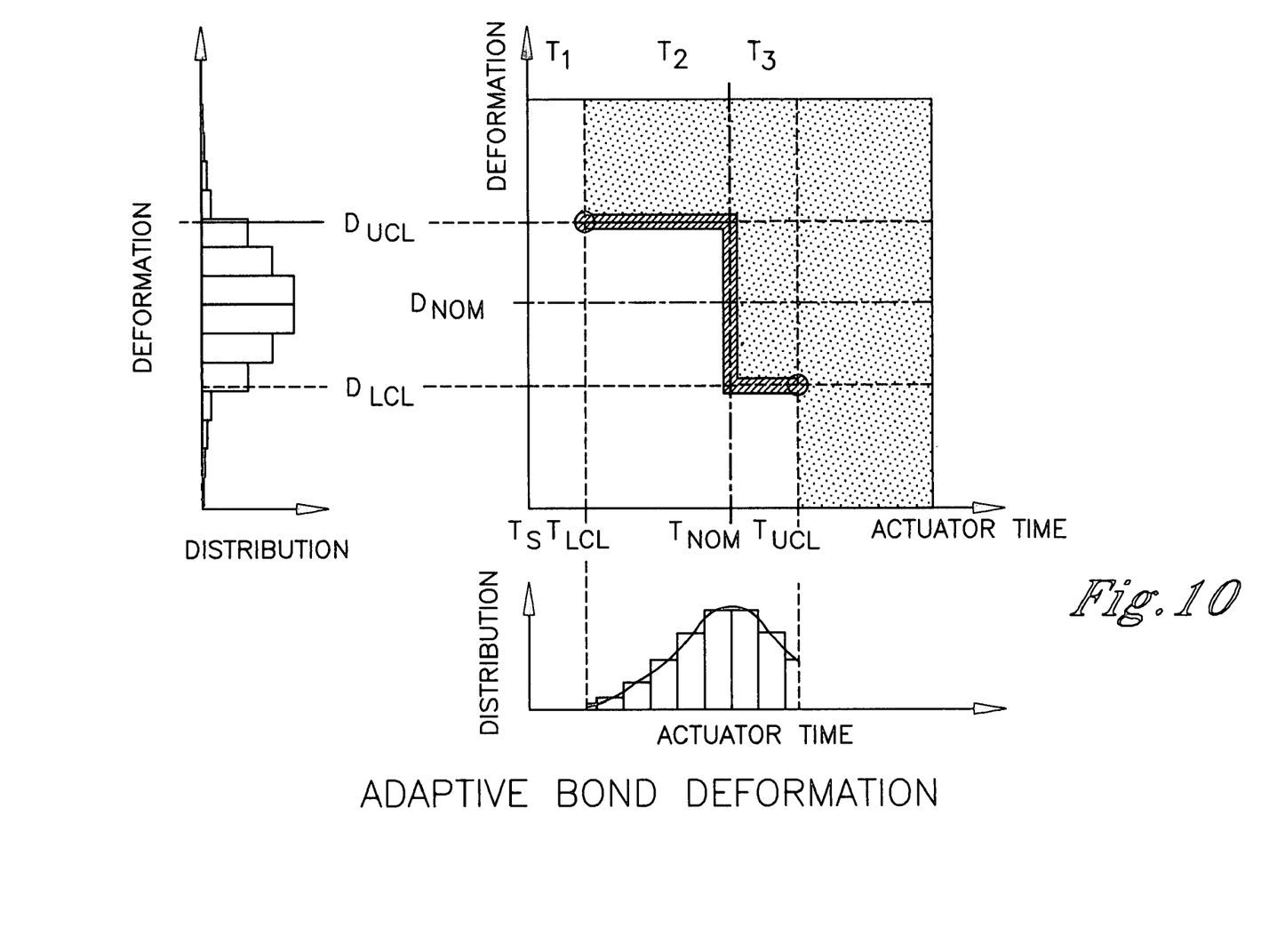
FIG. 10 is a graphical representation of an alternate process control procedure of the present invention applied to an energy application step encompassed by the deformation stage of FIG. 8.

Referring to FIG. 10, a generalized graphical representation of a second embodiment of a process control procedure of the present invention is shown applied to the energy application step of a bonding process. FIG. 10 includes an operational graph displaying the manner in which the specified process control parameters logically constrain the operating regime of the bonding process. The process control parameters and corresponding axes in the operational graph of FIG. 10 are essentially the same as FIG. 9.

In accordance with the present embodiment, a practitioner initially sets a nominal value for each of the process control parameters in the same manner as above with respect to FIG. 9. However, once the nominal deformation value $D_{NOM}$ and the nominal actuator time value $T_{NOM}$ are set, the practitioner uses the nominal values as a baseline not only for setting a deformation upper control limit $D_{UCL}$ and an actuator time upper control limit $T_{UCL}$ in the same manner as FIG. 9, but also for setting a deformation lower control limit $D_{LCL}$ and an actuator time lower control limit $T_{LCL}$. The deformation lower control limit $D_{LCL}$ is preferably set to a minimum deformation value of the deformed bond member which is tolerable in the bonding process. Thus, the deformation upper and lower control limits $D_{UCL}$ and $D_{LCL}$ may be set such that only deformed bond members exhibiting an acceptable degree of deformation which are above the deformation lower control limit $D_{LCL}$ and below the deformation upper control limit $D_{UCL}$ are produced by the bonding process, while essentially no deformed bond members exhibiting an unacceptable degree of deformation which is above the deformation upper control limit $D_{UCL}$ or below the deformation lower control limit $D_{LCL}$ are produced.

The actuator time lower control limit $T_{LCL}$ is similarly preferably set to a minimum actuator time value which is tolerable in the bonding process. Thus, the actuator time upper and lower control limits $T_{UCL}$ and $T_{LCL}$ may be set such that the time for each cycle of the bonding process is never below a time value at which the bonding precursor member receives an insufficient level of bond energy to effect formation of this deformed bond member nor above a time value which exceeds the economic efficiency limits of the bonding machine.

Initial operation of the bonding machine proceeds in essentially the same manner as recited above with respect to FIG. 9 until initiation of the energy application step. Referring to the operational graph of FIG. 10, the energy application step starts at an actuator start time value $T_S$ under the direction of the present embodiment of the process control procedure by applying ultrasonic energy to the bonding precursor member at a constant steady-state level. The present embodiment of the process control procedure likewise continuously monitors deformation and actuator time to determine when the variable actuator shut-down time value $T_{SD}$ is set and effects shut-down of the energy application step upon setting the variable actuator shut-down time value $T_{SD}$. The monitored values of the deformation and actuator time are used in association with the deformation and actuator time upper control limits $D_{UCL}$ and $T_{UCL}$ as logic constraints to determine when the variable actuator shut-down time value $T_{SD}$ is set. However, unlike the embodiment of FIG. 9, the present embodiment additionally uses the nominal actuator time value $T_{NOM}$ and the deformation and actuator time lower control limits $D_{LCL}$ and $T_{LCL}$ as logic constraints to determine when the variable actuator shut-down time value $T_{SD}$ is set.

The actuator shut-down time value $T_{SD}$ is set only after the actuator time value T is greater than the actuator time lower control limit $T_{LCL}$. Thus, the actuator shut-down time value $T_{SD}$ is never set when the actuator time value T is in a time interval designated $T_1$ which is between $T_S$ and $T_{LCL}$. If the actuator time value T is in a time interval designated $T_2$, which is greater than or equal to the actuator time lower control limit $T_{LCL}$, but less than the nominal actuator time value $T_{NOM}$, the actuator shut-down time value $T_{SD}$ is only set if and when the deformation value D of the bonding precursor member is greater than the deformation upper control limit $D_{UCL}$. If the actuator time value T has exceeded the time interval $T_2$ without setting the actuator shut-down time value $T_{SD}$ and the actuator time value T is in a time interval designated $T_3$, which is greater than or equal to the nominal actuator time value $T_{NOM}$, but less than the actuator time upper control limit $T_{UCL}$, the actuator shut-down time value $T_{SD}$ is only set if and when the deformation value D of the bonding precursor member is greater than the deformation lower control limit $D_{LCL}$. If the actuator time value T has exceeded the time interval $T_3$ without setting the actuator shut-down time value $T_{SD}$ and the actuator time value T reaches the actuator time upper control limit $T_{UCL}$, the actuator shut-down time value $T_{SD}$ is automatically set at the actuator time upper control limit $T_{UCL}$ independent of the deformation value D of the bonding precursor member.

The above-described embodiment of the process control procedure is characterized as the adaptive bond deformation logic sequence and is summarized in Table 2 below.

TABLE 2

| ACTUATOR TIME INTERVAL | ACTION |
| --- | --- |
| $T = T_S$ | switch ultrasonic transducer to "ON" condition |
| $T_1: T_S < T < T_{LCL}$ | maintain ultrasonic transducer in "ON" condition independent of D |
| $T_2: T_{LCL} \leq T < T_{NOM}$ | switch ultrasonic transducer to "OFF" condition if and when $D > D_{UCL}$ $T = T_{SD}; T_{LSL} \leq T_{SD} < T_{NOM}$ |
| $T_3: T_{NOM} \leq T < T_{UCL}$ | switch ultrasonic transducer to "OFF" condition if and when $D > D_{LCL}$ $T = T_{SD}; T_{NOM} \leq T_{SD} < T_{UCL}$ |
| $T = T_{UCL}$ | switch ultrasonic transducer to "OFF" condition independent of D $T = T_{SD}; T_{SD} = T_{UCL}$ |

Practicing a bonding process which is logically constrained by the selected deformation and actuator time upper control limits $D_{UCL}$ and $T_{UCL}$, the nominal actuator time value $T_{NOM}$, and the deformation and actuator time lower control limits $D_{LCL}$ and $T_{LCL}$ in accordance with the present embodiment of the process control procedure produces a plurality of deformed bond members having different final deformation values $D_F$ which form a relatively narrow essentially symmetrical distribution about the nominal deformation value $D_{NOM}$. An exemplary deformation distribution is displayed in the deformation distribution graph of FIG. 10 positioned adjacent to the operational graph of FIG. 10. The present embodiment of the process control procedure likewise produces a plurality of deformed bond members having different actuator shut-down time values $T_{SD}$ which form an asymmetrical distribution about the nominal actuator time value $T_{NOM}$. An exemplary distribution of the actuator shut-down time values $T_{SD}$ is displayed in the time distribution graph of FIG. 10, which is positioned adjacent to the operational graph of FIG. 10.

Although both embodiments of the process control procedure are described above as only using the deformation which occurs during the energy application step to logically constrain the operating regime of the bonding process, it is within the scope of the present invention, applying the teaching disclosed herein, to use the deformation which occurs during the entire deformation stage including the deformation occurring during the peak force substep to logically constrain the operating regime of the bonding process. In accordance with an alternate embodiment of the present process control procedure, instantaneous time values for the entire deformation stage $T^D$ are continuously monitored along with the instantaneous deformation values D to essentially instantaneously determine when to set the variable actuator shut-down time value $T_{SD}$ and the energy application step is shut down upon setting the actuator shut-down time value $T_{SD}$.

In any case, the bulk of the deformation occurring during the deformation stage typically occurs during the energy application step. Thus, it is generally sufficient and preferable to only use the deformation which occurs during the energy application step as a logic constraint for the present process control procedure.

Figure 11:
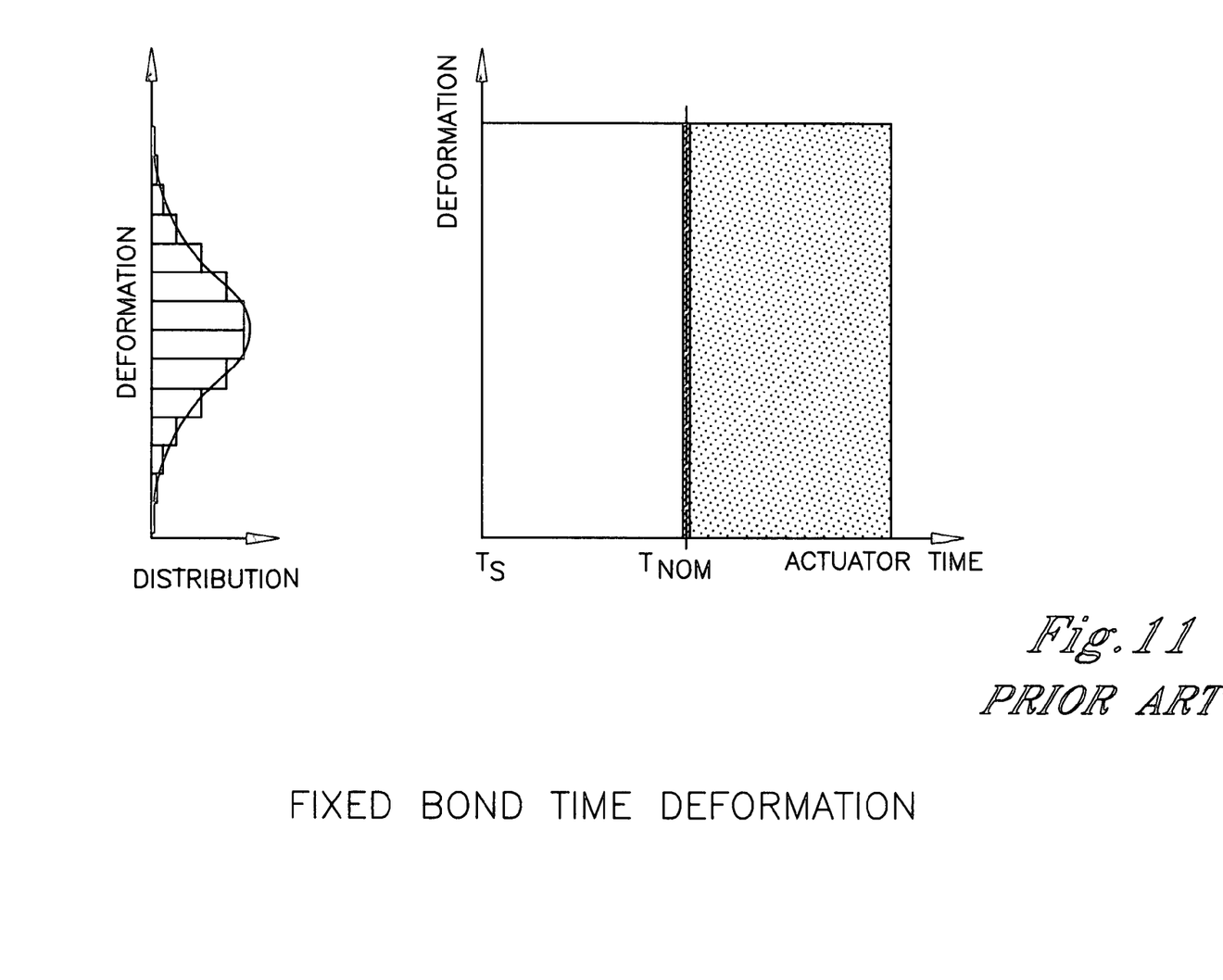
FIG. 11 is a graphical representation of a prior art process control procedure applied to an energy application step encompassed by the deformation stage of FIG. 8.

For purposes of comparison, FIG. 11 displays a generalized graphical representation of a prior art process control procedure applied to the energy application step of a bonding process. FIG. 11 includes an operational graph having essentially the same axes as FIGS. 9 and 10. In accordance with the prior art process control procedure, the practitioner determines the nominal actuator time value $T_{NOM}$ and sets a fixed actuator shut-down time value $T_{SD}$ in correspondence with the nominal actuator time value $T_{NOM}$. The actuator shut-down time value $T_{SD}$ is the only process control parameter value stored in the memory of the computer associated with the bonding machine.

Initial operation of the bonding machine proceeds in essentially the same manner as recited above with respect to FIG. 9 until initiation of the energy application step. Referring to FIG. 11, the energy application step starts at an actuator start time value $T_S$ by applying ultrasonic energy to the bonding precursor member. However, the prior art process control procedure only monitors actuator time T. When the predetermine fixed actuator shut-down time value $T_{SD}$ is reached, shut-down of the energy application step is automatically effected. As such, the nominal actuator time value $T_{NOM}$ is the only logic constraint setting the actuator shut-down time value $T_{SD}$.

The above-described prior art process control procedure is characterized as the fixed bond time deformation logic sequence and is summarized in Table 3 below.

TABLE 3

| ACTUATOR TIME INTERVAL | ACTION |
| --- | --- |
| $T = T_S$ | switch ultrasonic transducer to "ON" condition |
| $T_S < T < T_{NOM}$ | maintain ultrasonic transducer in "ON" condition independent of any other process parameters |
| $T = T_{NOM}$ | switch ultrasonic transducer to "OFF" condition independent of any other process parameters $T = T_{SD} = T_{NOM}$ |

Practicing a bonding process which is logically constrained by only the nominal actuator time value $T_{NOM}$, in accordance with the prior art produces a plurality of deformed bond members having different final deformation values $D_F$ which form an undesirably broad distribution about the nominal deformation value $D_{NOM}$. An exemplary deformation distribution is displayed in the deformation distribution graph of FIG. 11 positioned adjacent to the operational graph of FIG. 11. Since the actuator shut-down time value $T_{SD}$ is fixed, there is no corresponding actuator time distribution.

While the forgoing preferred embodiments of the invention have been described and shown, it is understood that alternatives and modifications, such as those suggested and others, may be made thereto and fall within the scope of the invention.

We claim:

1. A process control procedure for a bonding process comprising:
   a) predetermining a deformation upper control limit for deforming a bonding precursor member;
   b) predetermining an actuator time upper control limit for a bonding energy actuator;
   c) defining a shut-down time value as corresponding to an earliest occurrence of a first shut-down condition or an earliest occurrence of a second shut-down condition, wherein said first shut-down condition occurs when a deformation value of said bonding precursor member reaches said deformation upper control limit before an actuator time value for said bonding precursor member reaches said actuator time upper control limit and said second shut-down condition occurs when an actuator time value for said bonding precursor member reaches said actuator time upper control limit before a deformation value of said bonding precursor member reaches said deformation upper control limit;

d) applying a first bonding energy to a first bonding precursor member from said activated bonding energy actuator;

e) deforming said first bonding precursor member in response to said first bonding energy while monitoring deformation values of said first bonding precursor member and actuator time values for said first bonding precursor member;

f) determining at a first monitored actuator time value for said first bonding precursor member that a first monitored deformation value of said first bonding precursor member has reached said deformation upper control limit before said first monitored actuator time value has reached said actuator time upper control limit, thereby triggering an earliest occurrence of said first shut-down condition for said first bonding precursor member;

g) shutting down application of said first bonding energy to said first bonding precursor member in response to said earliest occurrence of said first shut-down condition for said first bonding precursor member such that said first monitored actuator time value is a first shut-down time value;

h) producing a first acceptable deformed bond member from said first bonding precursor member having a first final deformation value substantially equal to said deformation upper control limit;

i) applying a second bonding energy to a second bonding precursor member from said activated bonding energy actuator;

j) deforming said second bonding precursor member in response to said second bonding energy while monitoring deformation values of said second bonding precursor member and actuator time values for said second bonding precursor member;

k) determining at a second monitored actuator time value for said second bonding precursor member that said second monitored actuator time value has reached said actuator time upper control limit before a second monitored deformation value of said second bonding precursor member has reached said deformation upper control limit, thereby triggering an earliest occurrence of said second shut-down condition for said second bonding precursor member;

l) shutting down application of said second bonding energy to said second bonding precursor member in response to said earliest occurrence of said second shut-down condition for said second bonding precursor member such that said second monitored actuator time value is a second shut-down time value; and m) producing a second acceptable deformed bond member from said second bonding precursor member having a second final deformation value substantially less than said deformation upper control limit.

2. The process control procedure of claim 1, wherein said bonding precursor member is a free air ball, an intact wire or an intact tab lead.

3. The process control procedure of claim 1, wherein said first or second acceptable deformed bond member is a ball bond, a ball bump, a stitch bond or a tab bond.

4. The process control procedure of claim 1, wherein said bonding energy actuator is an ultrasonic transducer and said bonding energy is ultrasonic energy.

5. The process control procedure of claim 1 further comprising serially repeating steps e)-h) and/or i)-m) for a series of additional precursor bonding members to produce a series of additional acceptable deformed bond members from said series of additional bonding precursor members, wherein all of said final deformation values for said acceptable deformed bond members form a distribution of final deformation values.

6. The process control procedure of claim 5, wherein all of said final deformation values form a constrained deformation distribution narrower than a deformation distribution for a plurality of deformed bond members each having a final deformation value determined by a fixed predetermined shutdown time value.

7. The process control procedure of claim 5 further comprising predetermining a nominal deformation value for a bonding precursor member less than said deformation upper control limit.

8. The process control procedure of claim 7, wherein said final deformation values are distributed about said nominal deformation value.

9. The process control procedure of claim 7 further comprising predetermining a nominal actuator time value for a bonding energy actuator less than said actuator time upper control limit.

10. The process control procedure of claim 9, wherein said nominal actuator time value corresponds to a desired shutdown time value for a bonding precursor member and said nominal deformation value corresponds to a desired final deformation value for an acceptable deformed bond member.

11. A process control procedure for a bonding process comprising:

a) predetermining a deformation upper control limit for deforming a bonding precursor member;

b) predetermining a deformation lower control limit for deforming said bonding precursor member;

c) predetermining an actuator time upper control limit for a bonding energy actuator;

d) predetermining an actuator time lower control limit for said bonding energy actuator;

e) predetermining a nominal actuator time value for said bonding energy actuator between said actuator time upper control limit and said actuator time lower control limit;

f) applying a first bonding energy to a first bonding precursor member from said activated bonding energy actuator beginning at an actuator start time, wherein said actuator start time and said actuator time lower control limit define bounds of a first time interval, said actuator time lower control limit and said nominal actuator time value define bounds of a second time interval, and said nominal actuator time value and said actuator time upper control limit define bounds of a third time interval;

g) deforming said first bonding precursor member in response to said first bonding energy while monitoring instantaneous deformation values of said first bonding precursor member and instantaneous actuator time values of said bonding energy actuator for said first bonding precursor member;

h) shutting down application of said first bonding energy to said first bonding precursor member at a first shut-down time value outside said first time interval;

i) shutting down application of said first bonding energy to said first bonding precursor member at a first shut-down time value within said second time interval if and when an instantaneous deformation value of said first bonding precursor member is greater than said deformation upper control limit within said second time interval;

j) shutting down application of said first bonding energy to said first bonding precursor member at a first shut-down time value within said third time interval if and when an instantaneous deformation value of said first bonding precursor member is greater than said deformation lower control limit within said third time interval;

k) shutting down application of said first bonding energy to said first bonding precursor member at a first shut-down time value equal to said actuator time upper control limit if an instantaneous actuator time reaches said actuator time upper control limit before an instantaneous deformation value reaches said deformation lower control limit;

l) producing a first acceptable deformed bond member in accordance with step h) and step i), j) or k) from said first bonding precursor member having a first final deformation value;

m) applying a second bonding energy to a second bonding precursor member from said activated bonding energy actuator beginning at an actuator start time;

n) deforming said second bonding precursor member in response to said second bonding energy while monitoring instantaneous deformation values of said second bonding precursor member and instantaneous actuator time values of said bonding energy actuator for said second bonding precursor member;

o) shutting down application of said second bonding energy to said second bonding precursor member at a second shut-down time value outside said first time interval;

p) shutting down application of said second bonding energy to said second bonding precursor member at a second shut-down time value within said second time interval if and when an instantaneous deformation value of said second bonding precursor member is greater than said deformation upper control limit within said second time interval;

q) shutting down application of said second bonding energy to said second bonding precursor member at a second shut-down time value within said third time interval if and when an instantaneous deformation value of said second bonding precursor member is greater than said deformation lower control limit within said third time interval; and r) shutting down application of said second bonding energy to said second bonding precursor member at a second shut-down time value equal to said actuator time upper control limit if an instantaneous actuator time reaches said actuator time upper control limit before an instantaneous deformation value reaches said deformation lower control limit;

s) producing a second acceptable deformed bond member in accordance with step o) and step p), q) or r) from said second bonding precursor member, wherein said second acceptable deformed bond member has a second final deformation value substantially not equal to said first final deformation value.

12. The process control procedure of claim 11, wherein said bonding precursor member is a free air ball, an intact wire or an intact tab lead.

13. The process control procedure of claim 11, wherein said first or second acceptable deformed bond member is a ball bond, a ball bump, a stitch bond or a tab bond.

14. The process control procedure of claim 11, wherein said bonding energy actuator is an ultrasonic transducer and said bonding energy is ultrasonic energy.

15. The process control procedure of claim 11 further comprising predetermining a nominal deformation value for deforming a bonding precursor member less than said deformation upper control limit.

16. The process control procedure of claim 15, wherein said nominal actuator time value corresponds to a desired shut-down time value for a bonding precursor member and said nominal deformation value corresponds to a desired final deformation value for an acceptable deformed bond member.

17. The process control procedure of claim 11 further comprising: serially repeating steps f)-l) and/or m)-s) for a series of additional precursor bonding members to produce a series of additional acceptable deformed bond members from said series of additional bonding precursor members, wherein all of said final deformation values for said acceptable deformed bond members form a distribution of final deformation values.

18. The process control procedure of claim 17, wherein, all of said final deformation values form a constrained deformation distribution narrower than a deformation distribution for a plurality of deformed bond members each having a final deformation value determined by a fixed predetermined shut-down time value.

19. A process control procedure for a bonding process comprising:

predetermining a deformation limit for deforming a bonding precursor member;

predetermining a deforming time limit for deforming a bonding precursor member;

defining a shut-down time value as corresponding to an earliest occurrence of a first shut-down condition or an earliest occurrence of a second shut-down condition, wherein said first shut-down condition occurs when a deformation value of said bonding precursor member reaches said deformation limit before a deforming time value for said bonding precursor member reaches said deforming time limit and said second shut-down condition occurs when a deforming time value for said bonding precursor member reaches said deforming time limit before a deformation value of said bonding precursor member reaches said deformation limit;

deforming a first bonding precursor member while monitoring deformation values of said first bonding precursor member and deforming time values for said first bonding precursor member;

determining at a first monitored deforming time value for said first bonding precursor member that a first monitored deformation value of said first bonding precursor member has reached said deformation limit before said first monitored deforming time value has reached said deforming time limit, thereby triggering an earliest occurrence of said first shut-down condition for said first bonding precursor member;

shutting down deformation of said first bonding precursor member in response to said earliest occurrence of said first shut-down condition for said first bonding precursor member such that first monitored deforming time value is said first shut-down time value;

producing a first acceptable deformed bond member from said first bonding precursor member having a first final deformation value substantially equal to said deformation limit;

deforming a second bonding precursor member while monitoring deformation values for said second bonding precursor member and deforming time values for said second bonding precursor member;

determining at a second monitored deforming time value for said second bonding precursor member that said second monitored deforming time value has reached said deforming time limit before a second monitored deformation value of said second bonding precursor member has reached said deformation limit, thereby triggering an earliest occurrence of said second shut-down condition for said second bonding precursor member;

shutting down deformation of said second bonding precursor member in response to said earliest occurrence of said second shut-down condition for said second bonding precursor member such that said second monitored deforming time value is a second shut-down time value; and producing a second acceptable deformed bond member from said second bonding precursor member having a second final deformation value substantially less than said deformation limit.

20. The process control procedure of claim 1, wherein said first shut-down time value is substantially less than said second shut-down time value.

21. The process control procedure of claim 1, wherein application of said first bonding energy is essentially constant.

22. The process control procedure of claim 21, wherein said first bonding energy and said second bonding energy are essentially equal.

23. The process control procedure of claim 1, wherein said first bonding precursor member is deformed before said second bonding precursor member.

24. The process control procedure of claim 1, wherein said second bonding precursor member is deformed before said first bonding precursor member.

25. The process control procedure of claim 11, wherein said first shut-down time value is substantially less than said second shut-down time value.

26. The process control procedure of claim 11, wherein application of said first bonding energy is essentially constant.

27. The process control procedure of claim 26, wherein said first bonding energy and said second bonding energy are essentially equal.

28. The process control procedure of claim 19, wherein said first shut-down time value is substantially less than said second shut-down time value.

* * * * *